(12) United States Patent
Kenyon

(10) Patent No.: US 11,025,196 B2
(45) Date of Patent: Jun. 1, 2021

(54) LC OSCILLATOR DRIVEN BY A NEGATIVE RESISTANCE ELEMENT

(71) Applicant: TEXAS INSTRUMENTS INCORPORATED, Dallas, TX (US)

(72) Inventor: Eleazar Walter Kenyon, Atlanta, GA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/248,850

(22) Filed: Jan. 16, 2019

(65) Prior Publication Data

US 2020/0228059 A1 Jul. 16, 2020

(51) Int. Cl.
*H03B 5/12* (2006.01)

(52) U.S. Cl.
CPC ......... *H03B 5/1212* (2013.01); *H03B 5/1228* (2013.01); *H03B 5/1231* (2013.01); *H03B 2200/004* (2013.01)

(58) Field of Classification Search
CPC .. H03B 5/1212; H03B 5/1231; H03B 5/1228; H03B 2200/004
See application file for complete search history.

(56) References Cited

U.S. PATENT DOCUMENTS

| | | | |
|---|---|---|---|
| 7,336,138 B2* | 2/2008 | Kitamura | H03B 5/04 331/117 FE |
| 8,031,020 B1* | 10/2011 | Tu | H03K 3/013 331/117 FE |
| 2012/0286888 A1* | 11/2012 | Hsieh | H03B 5/1215 331/117 FE |

* cited by examiner

*Primary Examiner* — Jeffrey M Shin
(74) *Attorney, Agent, or Firm* — Ray A. King; Charles A. Brill; Frank D. Cimino

(57) ABSTRACT

An LC oscillator architecture in which an LC tank is driven by a negative resistance element (amplifier) including first and second Vbe/Vgs multipliers cross-coupled to the LC tank. Each Vbe/Vgs multiplier circuitry including a transistor with a control terminal as a negative input, a reference terminal as a positive input, and an output terminal, a shunt resistance connected between the control terminal and the reference terminal, a series resistance connected between the control terminal and the output terminal for one of the same transistor or the other transistor, and a shorting capacitance connected between the control terminal of the transistor, and the output terminal of the transistor of the other Vbe/Vgs multiplier. An example application is an LC VCO, such as for a PLL, CDR, or retimer.

15 Claims, 2 Drawing Sheets

LC OSCILLATOR DRIVEN BY A NEGATIVE RESISTANCE ELEMENT

BACKGROUND

LC oscillators can be configured with an LC tank with excitation provide by a negative resistance element, for example either a Class-B or Class-C negative resistance circuit.

A Class-B LC oscillator uses a cross-coupled transistor pair, with current bias. It provides robust startup and a simple design, but has low swing capability and noise efficiency.

A Class-C LC Oscillator uses a cross-coupled transistor pair with voltage bias, and shorting capacitors to decouple operation at LC oscillator frequency from DC biasing. It provides increased output voltage swing and low noise, but the bias required for reliable startup is higher than bias required for optimal noise/power tradeoff.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for an LC oscillator architecture in which an LC tank is driven by a negative resistance element/amplifier based on cross-coupled Vbe/Vgs multipliers, such as for LC VCO included in a PLL, CDR, or retimer.

According to aspects of the Disclosure, a circuit to provide LC oscillation signals can include LC tank circuitry, including an inductance and a capacitance coupled to form an LC tank, driven by amplifier circuitry to provide a negative resistance. The amplifier circuitry can include first and second Vbe/Vgs multipliers cross-coupled to the LC oscillator circuitry, each Vbe/Vgs multiplier including: a transistor with a control terminal as a negative input, a reference terminal as a positive input, and an output terminal; a shunt resistance connected between the control terminal and the reference terminal; a series resistance connected between the control terminal and the output terminal for one of the same transistor or the other transistor; a shorting capacitance connected between the control terminal of the transistor, and the output terminal of the transistor of the other Vbe/Vgs multiplier.

In other aspects of the disclosure, an LC oscillator circuit can be configured to drive an external LC tank circuit to generate LC oscillation signals (the LC tank circuit configurable from discrete inductance and capacitance components external to the circuit). The LC oscillator circuit can include amplifier circuitry to drive an external LC tank circuit with a negative resistance. The amplifier circuitry can include first and second Vbe/Vgs multipliers cross-coupled to the LC oscillator circuitry, each Vbe/Vgs multiplier including: a transistor with a control terminal as a negative input, a reference terminal as a positive input, and an output terminal; a shunt resistance connected between the control terminal and the reference terminal; a series resistance connected between the control terminal and the output terminal for one of the same transistor or the other transistor; and a shorting capacitance connected between the control terminal of the transistor, and the output terminal of the transistor of the other Vbe/Vgs multiplier.

In other aspects of the disclosure, a method of generating LC oscillation signals using an LC tank, includes driving the LC tank circuit with a negative resistance, and generating the negative resistance using first and second Vbe/Vgs multipliers cross-coupled to the LC tank circuit. Each Vbe/Vgs multiplier can include: a transistor with a control terminal as a negative input, a reference terminal as a positive input, and an output terminal; a shunt resistance connected between the control terminal and the reference terminal; a series resistance connected between the control terminal and the output terminal for one of the same transistor or the other transistor; and a shorting capacitance connected between the control terminal of the transistor, and the output terminal of the transistor of the other Vbe/Vgs multiplier.

Other aspects and features of the invention claimed in this Patent Document will be apparent to those skilled in the art from the following Disclosure.

BRIEF DESCRIPTION OF THE DRAWINGS

FIG. 1 illustrates an example LC oscillator with an example negative resistance amplifier/element 120 in which the cross-coupled Vbe multipliers 121/122 include cross-coupled transistors NPNa/NPNb, series and shunt resistors RSS and RSH, and shorting capacitors CSa and CSb, with the series resistors RSS coupled between a base terminal of one transistor and a collector terminal of the other transistor.

FIG. 2 illustrates an example LC oscillator with an example negative resistance amplifier/element 220 in which the cross-coupled Vbe multipliers 221/222 include cross-coupled transistors NPNa/NPNb, series and shunt resistors RSS and RSH, and shorting capacitors CSa and CSb, with the series resistors RSS coupled between a base terminal of one transistor and a collector terminal of the same transistor.

DETAILED DESCRIPTION

This Description and the Drawings constitute a Disclosure for an LC oscillator architecture in which an LC tank is driven by a negative resistance element/amplifier based on cross-coupled Vbe/Vgs multipliers, including describing design examples (example implementations), and illustrating various technical features and advantages.

This Disclosure uses the following nomenclature. A "Vbe/Vgs multiplier" means is one of a Vbe multiplier based on bipolar technology, and a Vgs multiplier based on mosfet technology. As used in a Vbe/Vgs multiplier, a transistor, bipolar or mosfet, has a control input/terminal (base/gate), a reference input/terminal (source/emitter), and an output/terminal (collector/drain). A Vbe/Vgs multiplier configuration includes a series resistor connected between the control and output terminals (negative input/feedback), and a shunt resistor connected between the control and reference terminals (positive input/feedback).

In brief overview, an LC oscillator architecture in which an LC tank is driven by a negative resistance element (amplifier) including first and second Vbe/Vgs multipliers cross-coupled to the LC tank. Each Vbe/Vgs multiplier circuitry including a transistor with a control terminal as a negative input, a reference terminal as a positive input, and an output terminal, a shunt resistance connected between the control terminal and the reference terminal, a series resistance connected between the control terminal and the output terminal for one of the same transistor or the other transistor, and a shorting capacitance connected between the control terminal of the transistor, and the output terminal of the transistor of the other Vbe/Vgs multiplier. An example application is an LC VCO, such as for a PLL, CDR, or retimer.

Figure 1:
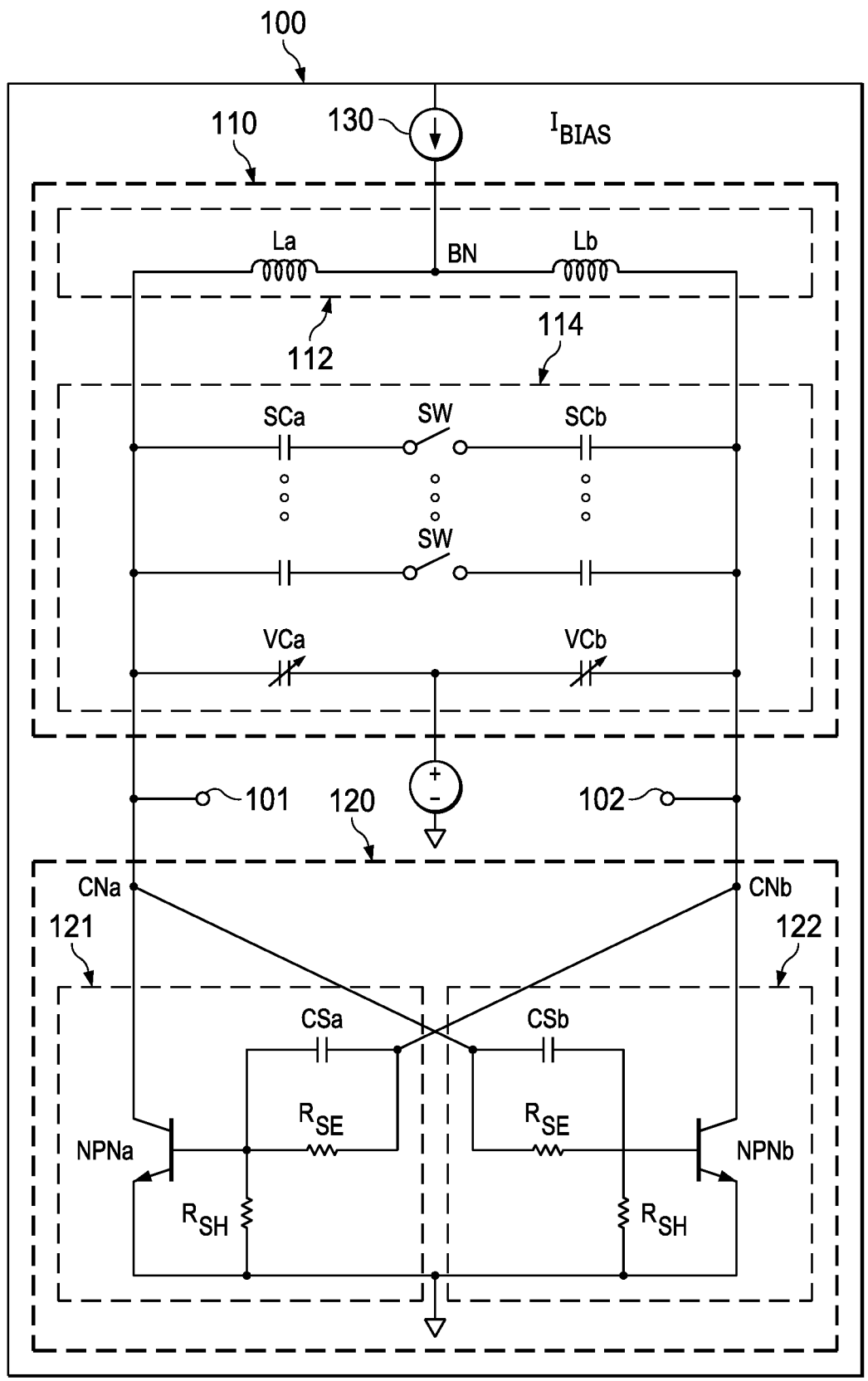
FIGS. 1-2 illustrate example LC oscillators 100/200 with LC tank circuitry 110/210, and example negative resistance amplifier/elements 120/220 formed by cross-coupled Vbe multipliers 120/220 driving the LC tank circuitry.
Figure 2:
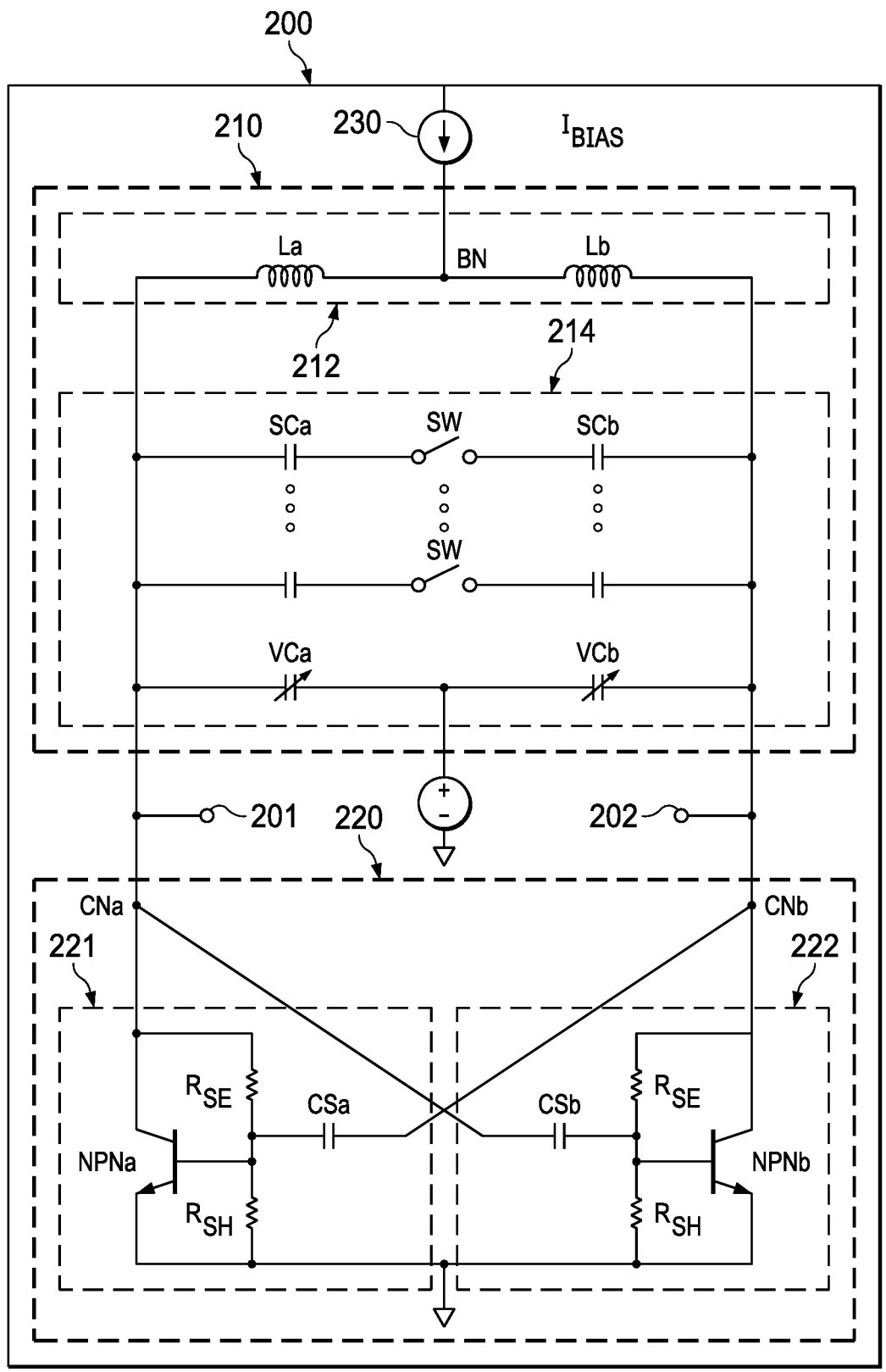

FIGS. 1-2 illustrate example LC oscillators, implemented as example LC VCOs (voltage controlled oscillators). The LC VCOs output LC oscillation signals at terminals 101/ 102, such as for use in a PLL, retimer or CDR.

The example LC VCOs 100/200 include LC tank circuitry 110/210, and a negative resistance amplifier/element 120/ 220 to drive the LC tank.

According to aspects of the Disclosure, the negative resistance amplifiers/elements 120/220 include cross-coupled Vbe multipliers 121/122 and 221/222 (bipolar implementation). The negative resistance amplifier/element drives the LC tank at the tuned oscillator frequency, compensating for losses in the LC tank. The LC tank driven at resonance, outputs an LC The example LC tank circuitry 110/210 includes inductance circuitry 112/212 and capacitance circuitry 114/214. The example inductance circuitry 112/212 includes inductors La and Lb series-connected at a bias node BN. The example capacitance circuitry includes series-connected variable capacitors (such as varactors) VCa/VCb, and a switched capacitor bank with capacitors SCa/SCb series connected through a switch SW. The variable capacitor VCa/VCb configuration can be used to provide variable tuning, such as for PLL frequency tuning. The switched capacitor bank configuration can be used to provide a selectable coarse tuning set point. The LC oscillator circuitry can be any suitable LC configuration/design forming an LC oscillator tank.

A current source 130 is configured/controlled to inject a bias current IBIAS into the LC tank circuitry at the bias node BN. Bias current injection into the LC oscillator 100/200 can be provided by any suitable biasing scheme, including, for example, a tail current network at the bottom of the LC oscillator 100/200 (Vbe/Vgs multipliers 120/220).

FIG. 1 illustrates an example negative resistance amplifier/element 120 in which the cross-coupled Vbe multipliers include cross-coupled transistors NPNa/NPNb (bipolar implementation), series and shunt resistors RSS and RSH, and shorting capacitors CSa and CSb. The series resistors RSS are cross-coupled between a base terminal of one NPN transistor and a collector terminal of the other NPN transistor. In this configuration, negative resistance can be generated across all frequencies based on constant positive feedback.

FIG. 2 illustrates an example negative resistance amplifier/element 220 in which the cross-coupled Vbe multipliers include cross-coupled transistors NPNa/NPNb (bipolar implementation), series and shunt resistors RSS and RSH, and shorting capacitors CSa and CSb, with the series resistors RSS coupled between a base terminal of one NPN transistor and a collector terminal of the same transistor. In this configuration, negative resistance is generated at high frequencies once the shorting capacitors short through the RSS/RSH bias network.

For any configuration of an LC oscillator architecture based on cross-coupled Vbe/Vgs multipliers as a negative resistance element according to the Disclosure, including the configurations of FIG. 1 and FIG. 2, the average bias is same: at lower frequency, the cross-coupled Vbe/Vgs multipliers operate with negative feedback, and at higher frequency with positive feedback. The series resistor RSE provides dc bias to the transistor base/gate.

With the Vbe/Vgs multiplier negative resistance element, the voltage at the output collector/drain of the cross-coupled transistor pair is a multiple of the base-emitter/gate-source diode voltage. The Vbe/Vgs multiplier architecture enables an increase in collector/drain output voltage, allowing an increase in allowable swing before the NPN BC junction forward biases, or the NMOS goes out of saturation, degrading noise performance. The shorting capacitors provide a low impedance at high frequencies, and squelch the noise contribution of the series resistors.

As long as the condition holds that the base/gate current is much less than the current through the shunt resistor, the collector/drain output voltage is a multiple of the base/gate control voltage defined by the ratio of the shunt resistor RSH to the series resistor RSE. The shunt resistor RSH decouples the base/gate and collector/drain voltages.

In summary, an LC oscillator according to the Disclosure includes LC oscillator circuitry (LC tank), and amplifier circuitry to provide a negative resistance. The amplifier circuitry can include first and second Vbe/Vgs multiplier circuities cross-coupled to the LC oscillator circuitry. Each Vbe/Vgs multiplier can include a transistor with a control terminal as a negative input, a reference terminal as a positive input, and an output terminal, and can be configured with a shunt resistance connected between the control terminal and the reference terminal, a series resistance connected between the control terminal and the output terminal for either the same or the other transistor, and a shorting capacitance cross-connected between the transistor control terminal, and the output terminal of the transistor of the other Vbe/Vgs multiplier. In an example implementation, the Vbe/Vgs multiplier can include the series resistance connected between the transistor control terminal, cross-connected to the output terminal of the transistor of the other Vbe/Vgs multiplier, in parallel with the cross-connected shorting capacitance.

In a bipolar implementation, the amplifier circuitry can include first and second Vbe multipliers, including cross-coupled NPN, with each Vbe multiplier including a shunt resistor connected between the NPN base and emitter, a series resistor connected between the NPN base and the collector of either the same or the other NPN, and with a shorting capacitor cross-connected between the NPN base and the collector of the other NPN. In a mosfet implementation the amplifier circuitry can include first and second Vgs multipliers, including cross-coupled NMOS, with each Vgs multiplier including a shunt resistor connected between the NMOS gate and source, a series resistor connected between the NMOS gate and the drain of the same or the other NMOS, and a shorting capacitor cross-connected between the NMOS gate and the drain of the other NMOS.

The LC oscillator can include a bias current source coupled to the LC oscillator circuitry to provide a bias current. The LC oscillator circuitry can be an LC tank circuit, configured with: (a) inductance circuitry that can include first and second inductors connected in series at a bias node, connected to the bias current source, and (b) capacitance circuitry that can include first and second tuning capacitors connected in series, and in parallel with the series-connected first and second inductors, and can also include first and second fixed capacitors connected in series through a controllable switch, and in parallel with the first and second series-connected tuning capacitors.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit to provide LC oscillation signals, comprising:
    first and second inductors connected in series;
    first and second variable capacitors connected in series, and connected in parallel with the series-connected first and second inductors;
    a switched capacitor bank connected through a switch, and connected in parallel with the series-connected first and second inductors;
    an amplifier circuit connected in parallel with the series-connected first and second inductors, the amplifier circuit including:
        first and second voltage multiplier circuits cross-coupled to the series-connected first and second inductors, each voltage multiplier circuit including:
            a transistor having a control terminal, a reference terminal, and an output terminal;
            a shunt resistor connected between the control terminal and the reference terminal of the transistor in the same voltage multiplier circuit;
            a series resistor connected between the control terminal and the output terminal of the same transistor in the same voltage multiplier circuit; and
            a shorting capacitor connected between the control terminal of the transistor and the output terminal of the transistor of the other voltage multiplier circuit.

2. The circuit of claim 1, wherein, for each voltage multiplier circuit, the series resistance is connected between the control terminal of the transistor and the output terminal of the transistor of the other voltage multiplier circuit, in parallel with the shorting capacitance.

3. The circuit of claim 1, configured as a bipolar implementation in which:
    the amplifier circuitry includes first and second Vbe multiplier circuits, including cross-coupled NPN transistors, and each Vbe multiplier circuit includes:
        a shunt resistor connected between the base and emitter terminals of the NPN transistor,
        a series resistor connected between the base terminal of the NPN transistor and the collector terminal of the same NPN transistor, and
        a shorting capacitor connected to the control terminal.

4. The circuit of claim 1, configured as a mosfet implementation in which:
    the amplifier circuit includes first and second Vgs multiplier circuits, including cross-coupled NMOS transistors, and each Vgs multiplier circuit includes:
        a shunt resistor connected between the gate and source terminals of the NMOS transistor,
        a series resistor connected between the base terminal of the NMOS transistor and the drain terminal of the same NMOS transistor, and
        a shorting capacitor connected to the gate terminal.

5. The circuit of claim 1, wherein the shorting capacitors are configured to decouple DC biasing of the voltage multiplier circuits from operation at an oscillation frequency of the LC oscillation signals.

6. The circuit of claim 1, wherein
    the circuit to provide LC oscillation signals comprises an LC VCO (voltage controlled oscillator) including the first and second series-connected inductors connected in parallel with the capacitors and the amplifier circuit; and
    the circuit includes one of: a PLL, a retimer, and a CDR (clock and data recovery).

7. A circuit to drive an external LC tank circuit to provide LC oscillation signals, comprising:
    amplifier circuitry configured to drive an external LC tank circuit with a negative resistance, the amplifier circuitry including
        first and second voltage multiplier circuits cross-coupled to the LC tank circuit, each voltage multiplier circuit including:
            a transistor with a control terminal, a reference terminal, and an output terminal;
            a shunt resistor connected between the control terminal and the reference terminal;
            a series resistor connected between the control terminal and the output terminal of the same transistor in the same voltage multiplier circuit; and
            a shorting capacitor connected between the control terminal of the transistor, and the output terminal of the transistor of the other voltage multiplier;
    wherein the LC tank circuit includes:
        first and second inductors connected in series;
        first and second variable capacitors connected in series, and connected in parallel with the series-connected first and second inductors; and
        a switched capacitor bank connected through a switch, and connected in parallel with the series-connected first and second inductors.

8. The circuit of claim 7, wherein, for each voltage multiplier circuit, the shorting capacitance is connected in parallel with the series resistance.

9. The circuit of claim 7, configured as a bipolar implementation in which:
    the amplifier circuit includes first and second Vbe multiplier circuits, including cross-coupled bipolar NPN transistors, and each Vbe multiplier circuit includes:
        a shunt resistor connected between the base and emitter terminals of the NPN transistor,
        a series resistor connected between the base terminal of the NPN transistor and the collector terminal for the same NPN transistor, and
        a shorting capacitor connected to the control terminal.

10. The circuit of claim 7, configured as a mosfet implementation in which:
    the amplifier circuit includes first and second Vgs multiplier circuits, including cross-coupled MOS transistors, and each Vgs multiplier circuit includes:
        a shunt resistor connected between the gate and source terminals of the transistor,
        a series resistor connected between the base terminal of the NMOS transistor and the drain terminal of the same NMOS transistor, and
        a shorting capacitor connected to the gate terminal.

11. The circuit of claim 7, wherein the shorting capacitors are configured to decouple DC biasing of the voltage multiplier circuits from operation at an oscillation frequency of the LC tank circuit.

12. The circuit of claim 7, wherein the circuit to drive an external LC tank circuit to provide LC oscillation signals is configurable with the external LC tank circuit as an LC VCO (voltage controlled oscillator); and the circuit includes one of: a PLL, a retimer, and a CDR (clock and data recovery).

13. A method of generating LC oscillation signals using an LC tank circuit, comprising:

driving the LC tank circuit with a negative resistance, wherein the LC tank circuit includes:

first and second inductors connected in series;

first and second variable capacitors connected in series, and connected in parallel with the series-connected first and second inductors; and a switched capacitor bank connected through a switch, and connected in parallel with the series-connected first and second inductors;

generating the negative resistance using:

first and second voltage multipliers cross-coupled to the LC tank circuit, each voltage multiplier including:
a transistor with a control terminal, a reference terminal, and an output terminal,
a shunt resistor connected between the control terminal and the reference terminal of the same transistor,
a series resistor connected between the control terminal and the output terminal of the same transistor in the same voltage multiplier, and
a shorting capacitor connected between the control terminal of the transistor and the output terminal of the transistor of the other voltage multiplier.

14. The method of claim 13, wherein the method is used in an LC VCO (voltage controlled oscillator).

15. The method of claim 13, wherein, for each voltage multiplier, the shorting capacitance is connected in parallel with the series resistance.

* * * * *